US005671760A

United States Patent [19]
Nakagawa et al.

[11] Patent Number: 5,671,760
[45] Date of Patent: Sep. 30, 1997

[54] APPARATUS FOR CONTROLLING RESIST STRIPPING SOLUTION

[75] Inventors: Toshimoto Nakagawa, Kawasakishi; Kouzo Tsukada, Yokohamashi; Shu Ogawa, Nagareyamashi; Yoshitaka Sato, Yokohamashi; Shinichiro Shiotsu, Hyogoken, all of Japan

[73] Assignees: Hirama RIKA Kenkyujo Ltd., Kawasakishi; Nagase & Co., Ltd., Osaka, both of Japan

[21] Appl. No.: 352,739

[22] Filed: Dec. 2, 1994

[30] Foreign Application Priority Data

Dec. 29, 1993 [JP] Japan .................... 5-350797

[51] Int. Cl.$^6$ .................................... B08B 3/04
[52] U.S. Cl. ............... 134/56 R; 134/58 R; 134/95.3; 134/99.1
[58] Field of Search ............... 134/56 R, 57 R, 134/58 R, 95.1, 95.3, 99.1, 98.1, 100.1, 902, 103.1; 354/298, 324

[56] References Cited

U.S. PATENT DOCUMENTS

| | | | |
|---|---|---|---|
| 3,603,329 | 9/1971 | White et al. | 134/902 |
| 3,837,945 | 9/1974 | Chiang | 216/13 |
| 3,880,685 | 4/1975 | Rehm et al. | 134/902 |
| 4,190,481 | 2/1980 | Goffredo | 134/103 |
| 4,629,679 | 12/1986 | Uchida et al. | . |
| 4,688,918 | 8/1987 | Suzuki et al. | 134/902 |
| 4,728,560 | 3/1988 | Sirinyan et al. | . |
| 4,731,154 | 3/1988 | Hazlitt et al. | 134/113 |
| 5,223,881 | 6/1993 | Nakagawa et al. | . |
| 5,246,023 | 9/1993 | Breunsbach et al. | 134/57 R |
| 5,275,184 | 1/1994 | Nishizawa et al. | 134/902 |
| 5,279,771 | 1/1994 | Lee | . |
| 5,334,332 | 8/1994 | Lee | . |
| 5,381,807 | 1/1995 | Lee | . |
| 5,399,604 | 3/1995 | Sano et al. | . |

Primary Examiner—Frankie L. Stinson
Attorney, Agent, or Firm—Jones, Tullar & Cooper, P.C.

[57] ABSTRACT

A resist stripping solution is used in the stripping of resist in a liquid crystal board manufacturing process or semiconductor manufacturing process. The apparatus for controlling the resist stripping solution comprises a resist stripping solution discharge device for discharging resist stripping solution by detecting the dissolved resist concentration in the resist stripping solution using an absorption photometer, first replenishing device for replenishing organic solvent and alkanolamine such as MEA or the like by detecting the liquid level of the resist stripping solution using a liquid level gauge, and second replenishing device for replenishing at least one of organic solvent and alkanolamine such as MEA or the like by detecting the concentration of alkanolamine such as MEA or the like of the resist stripping solution by an absorption photometer. As a result, the quality of the resist stripping solution can always be constant, and the consumption volume of the solution, the operation down time and the cost can be notably reduced.

4 Claims, 8 Drawing Sheets

NUMBER OF BOARDS PROCESSED

DISSOLVED RESIST CONCENTRATION [g/ℓ]

APPARATUS FOR CONTROLLING RESIST STRIPPING SOLUTION

BACKGROUND OF THE INVENTION

The present invention relates to an apparatus for controlling resist stripping solution used in stripping resist in a liquid crystal board manufacturing process, a semiconductor manufacturing process or the like, and more particularly to an apparatus combining a continuous automatic replenishing mechanism of resist stripping solution, in cycle use an alkanolamine concentration regulating mechanism, and a resist stripping solution automatic discharge mechanism for arresting deterioration of resist stripping performance due to enrichment of dissolved resist.

The resist material used for a photolithography process in a liquid crystal manufacturing process, a semiconductor manufacturing process or the like, is divided into a positive type which has solubility by exposure and a negative type which has insolubility by exposure. The positive type resist is used mainly.

As a typical example of the positive type resist, a main resist components comprise a naphthoquinone-diazido photosensitive agent and an alkali soluble resin (novolak resin). At the final stage of a photolithography process, a process for completely removing the resist from the board must be installed.

In the resist stripping process of a liquid crystal board, a semiconductor or the like, an organic solvent solution, an organic alkaline solution, a blending solution of organic solvent and organic alkali, or the like, is used as a resist stripping solution.

For example, a dimethyl-sulfoxide solution, an N-methylpyrrolidone solution, a blending solution of glycolether and alkanolamine or the like, is used in a spray method or a dip method.

In the conventional method, starting by filling a resist stripping processing tank with the specified volume of a fresh resist stripping solution at the specified concentration, when the resist stripping solution is consumed and reaches a specified deterioration concentration region, on the basis of an empirical index such as the number of boards processed, the entire volume is exchanged with a prepared fresh solution in the batch operation system. This solution exchanging frequency varies with the tank volume, the type of boards and number of the boards, etc, but it is generally done about every four days.

When the resist stripping solution is deteriorated, the stripping speed is not constant, and the remainder of the resist stripping is broken out, and decline in yield occurs.

A non-aqueous resist stripping solution is generally used at the temperature range of 70° to 90° C. With regard to the boiling point of the components used for a resist stripping solution, organic solvent is about 190° to 240° C. and alkanolamine, for example, monoethanolamine (hereinafter called simply MEA) is 171° C.

Accordingly, an MEA concentration is lowered by a low boiling point substance, MEA vaporizing preferentially with a purge nitrogen gas for air seal to the resist stripping solution tank during operation, and then the concentration variation of the resist stripping solution is occurs.

In addition, the alkaline MEA concentration is lowered due to a reaction with acid in the dissolved resist, and the absorption and reaction of carbon dioxide in the air, or the decomposition of MEA itself. Therefore the efficiency of resist stripping declines sequentially, but, hitherto, the MEA concentration was not measured in real time and not controlled at a specified concentration.

Besides, the resist dissolved in the resist stripping solution in the resist stripping processing is gradually enriched, and it is a dominant cause of resist stripping performance deterioration, but conventionally the resist concentration was not measured in real time and not controlled at the specified concentration.

Therefore, in this period, the MEA concentration and the dissolved resist concentration vary with the passing of time and are not constant, and the remainder of the resist stripping is broken out. It was hence difficult to control the delicate dimensional precision in resist stripping the boards, the product quality was unstable, and the yield was lowered.

Besides, due to stopping (down time) for exchanging solution, the operation rate was significantly lowered, and the exchange work of the resist stripping solution required extra labor cost.

OBJECTS AND SUMMARY OF THE INVENTION

It is therefore a primary object of the present invention to solve the above-discussed problems of the prior art, while maintaining the advantages of the covenient line conveying system of the prior art which is suited to mass production in the liquid crystal board manufacturing process and the like.

In other words, it is an object of the present invention to automatically control the resist stripping solution to the specified alkanolamine concentration and the dissolved resist concentration upon preparing the alkanolamine source solution and the organic solvent source solution, to adequately control the solution replenishment in the resist stripping processing tank so as to always keep constant the resist stripping solution, to cut down the consumption volume of the source solutions, to shorten the operation stopping time markedly, and to reduce the comprehensive manufacturing cost.

The present invention is intended to adjust and control the resist concentration by measuring absorbance, by experimentally confirming that the concentration of the resist dissolved in the resist stripping solution in the resist stripping processing tank is correlated with its absorbance, and to adjust and control the MEA concentration by measuring absorbance, by experimentally confirming that the MEA concentration in the resist stripping solution is correlated with its absorbance.

To achieve the above objects, the present invention provides an apparatus for controlling a resist stripping solution, which comprises resist stripping solution discharge means for discharging the resist stripping solution by detecting the dissolved resist concentration in the resist stripping solution by means of an absorption photometer, first replenishing means for replenishing the organic solvent and the alkanolamine solution by detecting the liquid level of the resist stripping solution by a liquid level gauge, and second replenishing means for replenishing at least one of the organic solvent and the alkanolamine solution by detecting the alkanolamine concentration of the resist stripping solution by means of an absorption photometer.

In the apparatus for controlling a resist stripping solution according to the present invention, the first replenishing means, instead of replenishing the organic solvent and the alkanolamine solution, replenishes a fresh resist stripping solution by preliminarily blending the organic solvent and the alkanolamine solution.

The apparatus for controlling resist stripping solution of the present invention further comprises organic solvent and alkanolamine replenishing means for replenishing the organic solvent and the alkanolamine solution by detecting the dissolved resist concentration in the resist stripping solution by means of an absorption photometer, and organic solvent or/and alkanolamine replenishing means.

In the apparatus for controlling the resist stripping solution of the present invention, the third replenishing means instead of replenishing the organic solvent and the alkanolamine solution, replenishes a fresh resist stripping solution by preliminarily blending the organic solvent and the alkanolamine solution. In this case, the third replenishing means acts as fresh solution replenishing means.

Examples to be used as the organic solvent include, among others, dimethylsulfoxide source solution, N-methylpyrrolidone source solution and glycolether source solution.

Examples of alkanolamine to be used include, monoethanolamine, diethanolamine, triethanolamine, N,N-dimethylethanolamine, N,N-diethylethanolamine, aminoethylethanolamine, N-methyl-N,N-diethanolamine, N,N-dibutylethanolamine, N-methylethanolamine, 3-amino-1-propanol.

DETAILED DESCRIPTION OF THE PREFERRED EMBODIMENTS

Figure 1:
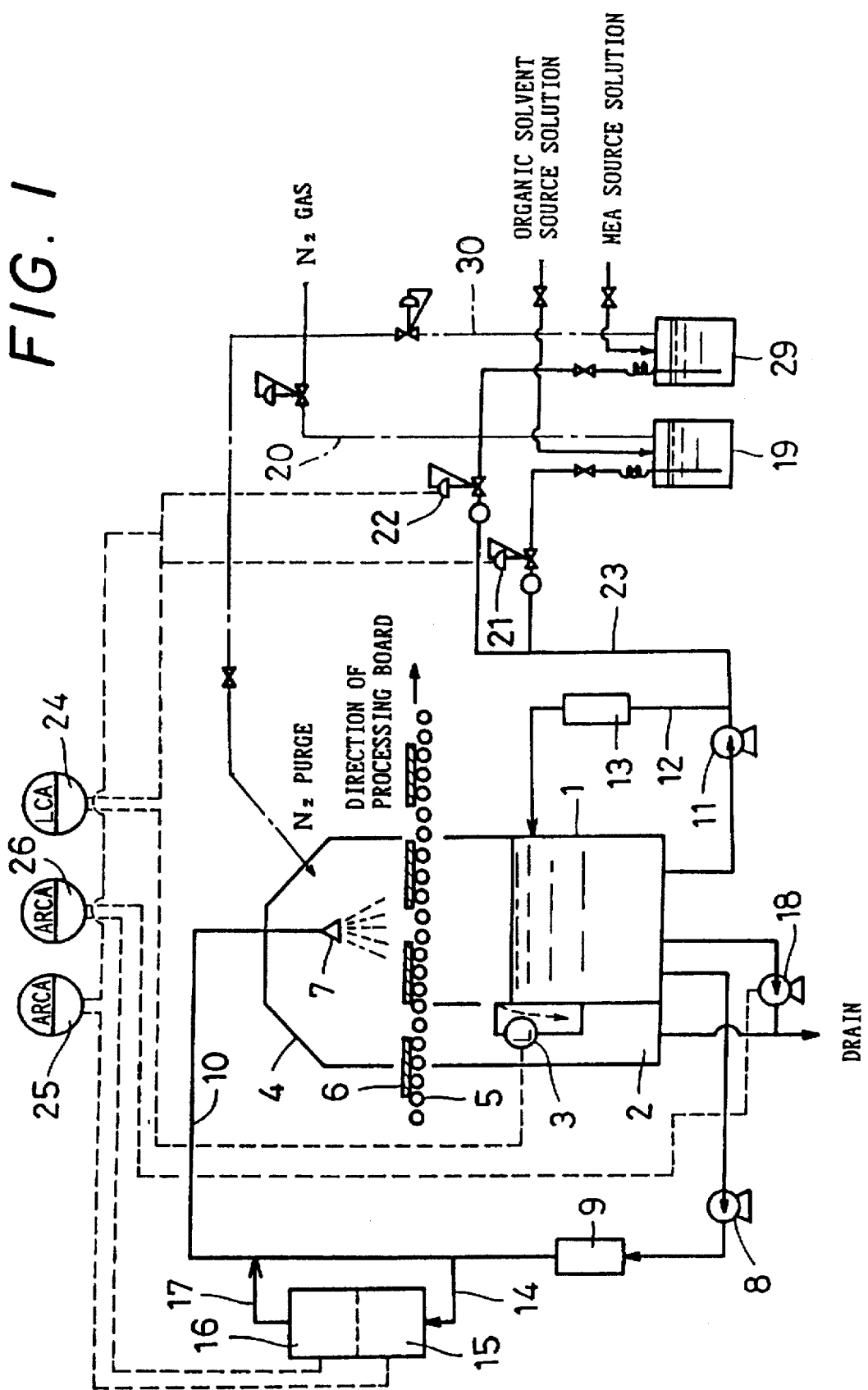
FIG. 1 is a schematic diagram of an apparatus for controlling the resist stripping solution according to an embodiment of the present invention.

Referring now to the drawings, some of the preferred embodiments of the present invention are described in detail below.

Figure 5:
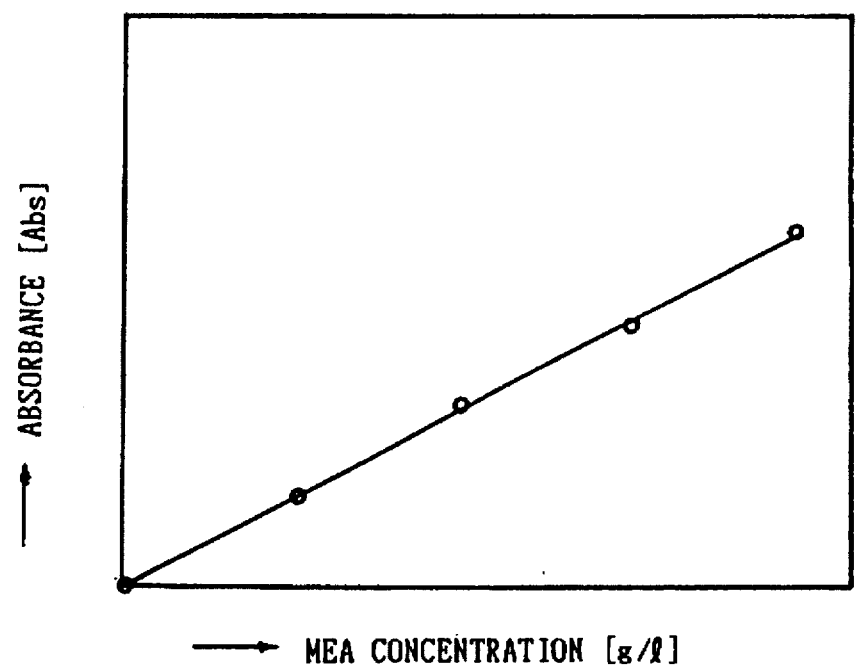
FIG. 5 is a graph of an embodiment showing the relation between the MEA concentration and the absorbance in the resist stripping solution relating to the present invention.
Figure 8:
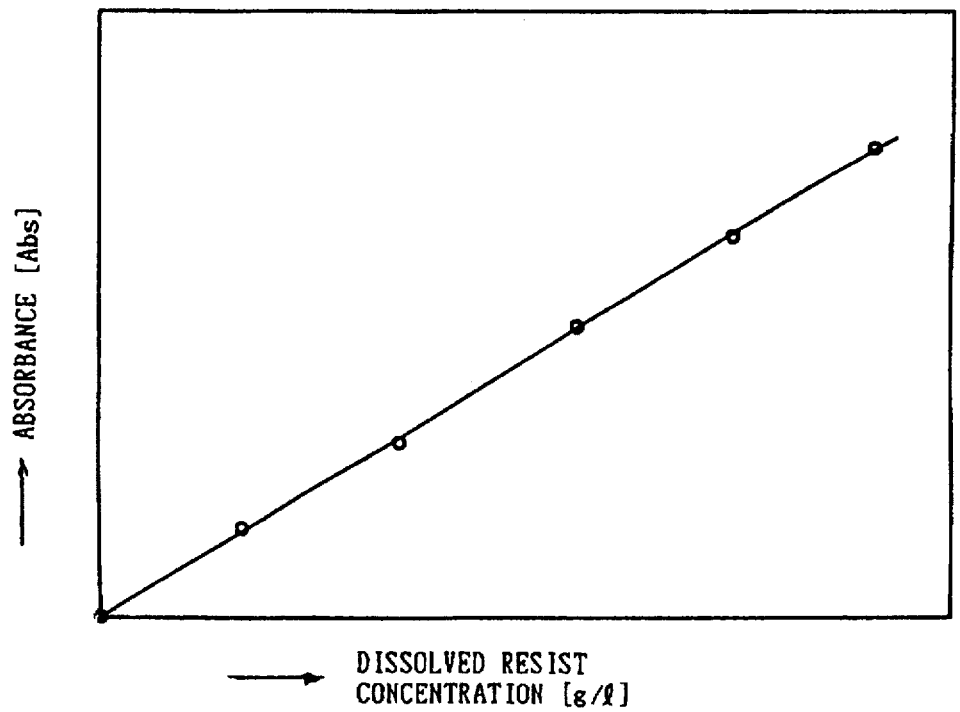
FIG. 8 is a graph of an embodiment showing the relation between the dissolved resist concentration and the absorbance in the resist stripping solution relating to the present invention.

The present invention is intended to adjust and control the resist concentration by measuring the absorbance and experimentally confirming that the concentration of the resist dissolved in the resist stripping solution in the resist stripping processing tank is correlated with its absorbance as shown in FIG. 8, and to adjust and control the MEA concentration by measuring the absorbance and experimentally confirming that the MEA concentration in the resist stripping solution is correlated with its absorbance as shown in FIG. 5.

As shown in FIG. 1, the present invention provides an apparatus for controlling the resist stripping solution which comprises resist stripping solution discharge means for discharging the resist stripping solution by detecting the dissolved resist concentration in the resist stripping solution by means of an absorption photometer 16, first replenishing means for replenishing the organic solvent and the alkanolamine solution by detecting the liquid level of the resist stripping solution by a liquid level gauge 3, and second replenishing means for replenishing at least one of the organic solvent and the alkanolamine solution by detecting the alkanolamine concentration of the resist stripping solution by means of an absorption photometer 15.

Figure 2:
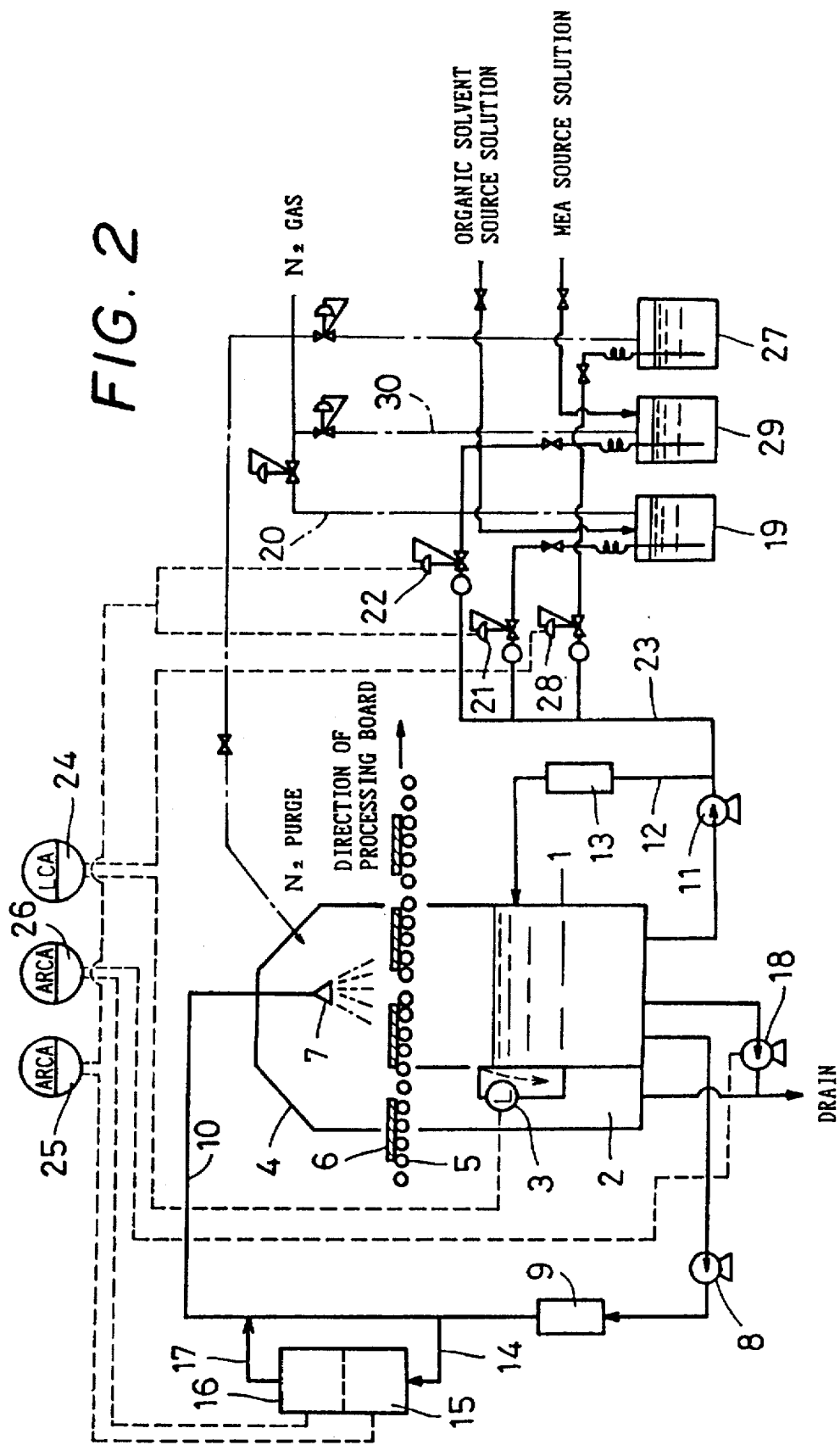
FIG. 2 is a schematic diagram of an apparatus for controlling the resist stripping solution according to another embodiment of the present invention.

In the apparatus for controlling the resist stripping solution of the present invention, the first replenishing means, as shown in FIG. 2, instead of replenishing the organic solvent and the alkanolamine solution, replenishes the fresh resist stripping solution by preliminarily blending the organic solvent and the alkanolamine solution.

Figure 3:
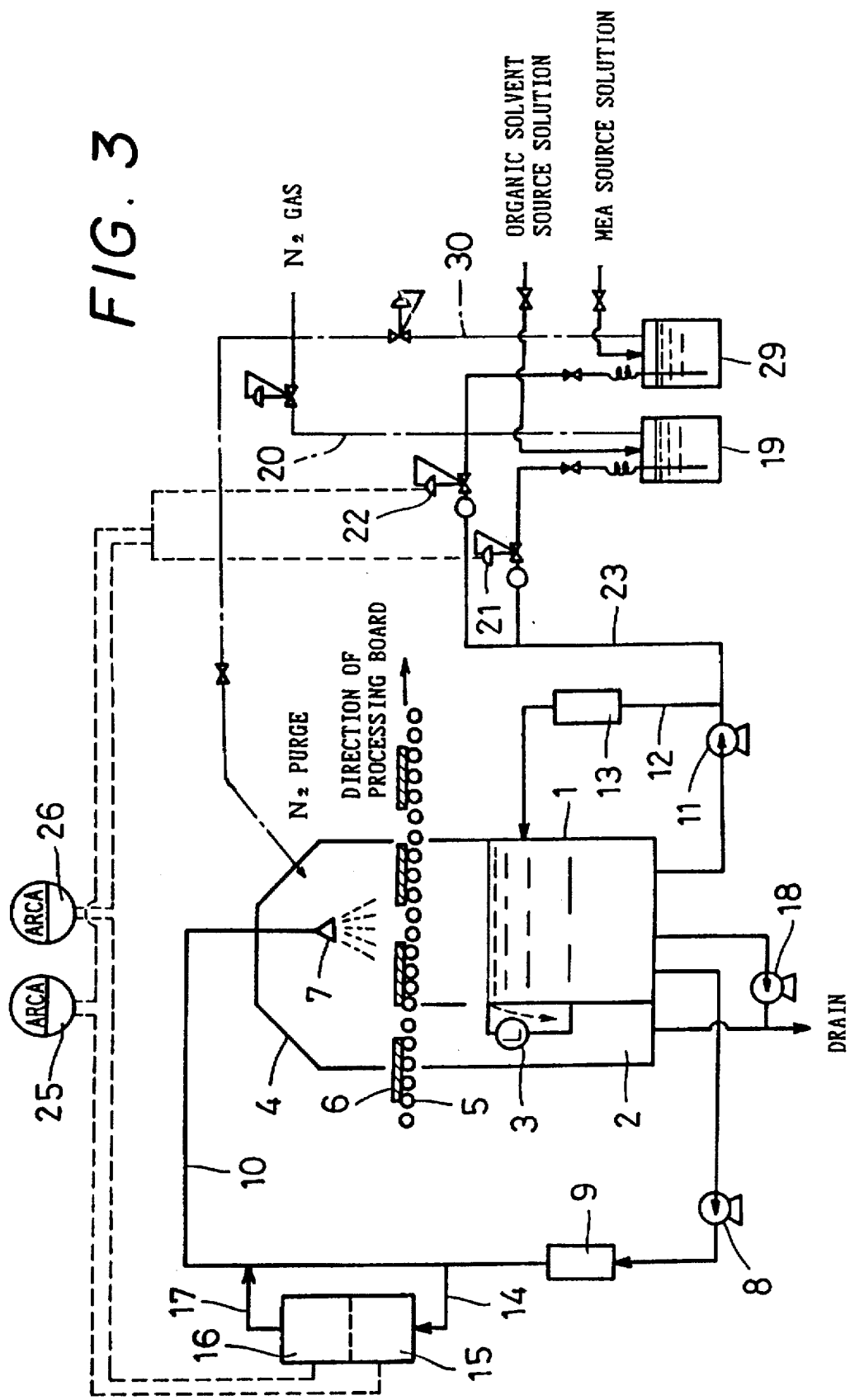
FIG. 3 is a schematic diagram of an apparatus for controlling the resist stripping solution according to a different embodiment of the present invention.

The apparatus for controlling the resist stripping solution of the present invention further comprises, as shown in FIG. 3, third replenishing means for replenishing the organic solvent and the alkanolamine solution by detecting the dissolved resist concentration in the resist stripping solution by means of an absorption photometer 16, and second replenishing means for replenishing at least one of the organic solvent and the alkanolamine solution by detecting the alkanolamine concentration of the resist stripping solution by means of an absorption photometer 15.

Figure 4:
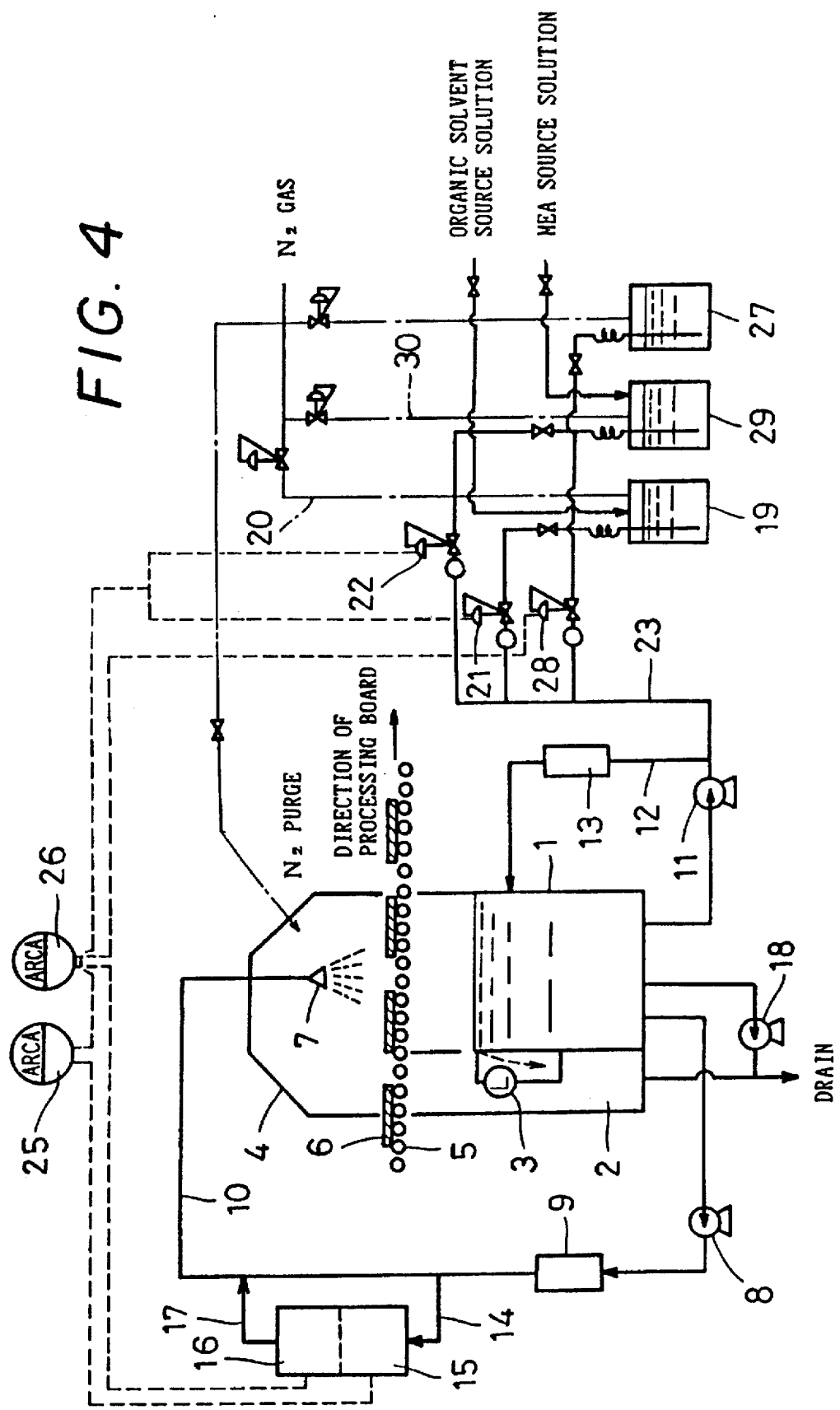
FIG. 4 is a schematic diagram of an apparatus for controlling the resist stripping solution according to a further different embodiment of the present invention.

In the apparatus for controlling the resist stripping solution of the present invention, as shown in FIG. 4, the third replenishing means for the organic solvent and the alkanolamine solution, instead of replenishing the organic solvent and the alkanolamine solution, replenishes the fresh resist stripping solution by preliminarily blending the organic solvent and the alkanolamine solution.

Some of the preferred embodiments of the present invention are described in the case of an MEA solution used as alkanolamine in detail below.

FIG. 1 is a schematic diagram of an apparatus showing an embodiment of the present invention. Reference numbers 1 to 13 correspond to the units for composing the conventional resist stripping processing apparatus.

That is, the conventional resist stripping processing apparatus comprises a resist stripping processing tank 1 for storing the resist stripping solution, an overflow tank 2, a liquid level gauge 3, a resist stripping compartment hood 4, a resist stripping solution spray 7, a liquid feed pump 8 for feeding the solution to the resist stripping solution spray, a filter 9 for removing fine particles from the resist stripping solution, roller conveyors 5 for moving boards 6 during resist stripping, a circulation pump 11 for clarifying and agitating the resist stripping solution, a filter 13 for removing fine particles, and pipes 20 for $N_2$ gas, the MEA solution, etc.

According to the present invention, the devices attached to the resist stripping processing apparatus include an absorption photometers 15 and 16, liquid discharge pump 18, organic solvent source solution feed tank 19, flow rate regulating valve 21 for feeding the organic solvent, MEA source solution (including the blending solution of MEA as a main component and organic solvent) feed tank 29, flow rate regulating valve 22 for feeding the MEA solution, piping for connecting these devices, and electrical instrumentation or pneumatic instrumentation.

The liquid volume stored in the resist stripping processing tank 1 is sufficient if enough is contained to feed the required volume for the resist stripping solution spray 7, but it must be controlled for stability of the process. The liquid level gauge 3 detects the liquid level drop due to a spontaneous decrease as the solution adheres to the boards and is brought outside during the resist stripping process, or detects the liquid level drop when the solution deteriorating in resist stripping performance is discharged by force. It controls the liquid volume in the resist stripping processing tank 1 in a specific range.

Here, the old resist stripping solution is passed into the drain pipe by operating the discharge pump 18. Or the old solution may be directly discharged out of the system without passing through the drain pipe.

The feed tank 19 of the organic solvent source solution (e.g. butyldiglycol; hereinafter called simply BDG., the boiling point of which is 230.6° C.) is pressurized to the range of 1 to 2 kgf/cm$^2$ by $N_2$ gas from the pipe 20, and the solution is fed under pressure as the organic solvent flow rate regulating valve 21 opens.

The feed tank 29 of the MEA source solution is pressurized to the range of 1 to 2 kgf/cm$^2$ by $N_2$ gas from the pipe 30, and the solution is fed under pressure as the MEA solution flow rate regulating valve 22 opens.

The organic solvent and the MEA solution are fed as the individual valves are regulated automatically, and are joined at the duct 23 and led to the duct 12, and enter into the resist stripping processing tank 1 and mixed with the circulating flow.

It is also possible to supply the organic solvent and the MEA solution directly into the duct 12 or resist stripping processing tank 1 without them being joining on the way.

It is, however, desired to join the organic solvent and the MEA solution at the duct 23 and then lead the mixture to the circulating duct 12 because they are mixed sufficiently.

A sample solution is fed from the duct 14 into the absorption photometer 15 and the absorption photometer 16 (for example, the two instruments are combined in one body) installed online in the duct 10 for the resist stripping solution spray, and both of the absorbances are measured continuously, and the measured solution is returned to the duct 10 through the duct 17.

It is also possible to install the absorption photometer 15 and the absorption photometer 16 separately.

FIG. 2 is a schematic diagram of an apparatus showing another embodiment of the present invention. In this embodiment, instead of replenishing the organic solvent and the MEA solution by detecting the liquid level of the resist stripping solution by the liquid level gauge 3, as shown in FIG. 2, the liquid level of the resist stripping solution is detected by the liquid level gauge 3, and a fresh resist stripping solution preliminarily blending the organic solvent and the MEA solution is replenished.

Feed tank 27 is for fresh resist stripping solution, and valve 28 is for regulating the fresh solution flow rate. The other construction is the same as that of FIG. 1.

FIG. 3 is a schematic diagram of an apparatus showing a different embodiment of the present invention. This embodiment is composed so as to detect the dissolved resist concentration in the resist stripping solution for resist by the absorption photometer 16, and replenish the organic solvent and the MEA solution. As shown in FIG. 3, usually, the liquid level is near the weir for overflow, and when at least one of the organic solvent and the MEA solution is replenished, the old resist stripping solution overflows from the overflow weir, and is discharged automatically.

The discharge pump 18 is not necessarily required, and a valve may be disposed in place of the discharge pump 18. The other construction is the same as that of FIG. 1.

FIG. 4 is a schematic diagram of an apparatus showing a further different embodiment of the present invention. This embodiment is designed to replenish a fresh resist stripping solution preliminarily blending the organic solvent and the MEA solution as shown in FIG. 4, instead of replenishing the organic solvent and the MEA solution in the third replenishing means for replenishing by detecting the dissolved resist concentration in the resist stripping solution for resist by the absorption photometer 16. The other construction is the same as that of FIG. 3.

The control system of the apparatus in the embodiment shown in FIG. 1 is now explained.

The liquid level gauge 3 and the liquid level in the resist stripping processing tank 1, the absorption photometer 15 and the MEA concentration of resist stripping solution, and the absorption photometer 16 and the dissolved resist concentration in the resist stripping solution function mutually independently in nature, but it is characteristic of the present invention to operate them in a mutually complementary relation.

In the first place, the target value of the MEA concentration of the resist stripping solution and the concentration limit value of the dissolved resist concentration necessary for quality control of the product boards must be preset in the controllers on the basis of experience or calculation.

The following is explained for an embodiment of using the resist stripping solution blending a BDG solution and a MEA solution.

Usually, the MEA concentration of the resist stripping solution, which is maintained at the constant temperature of about 80° C., is decreased by a low boiling point MEA vaporizing preferentially with purge nitrogen gas according as the number of boards processed increases, therefore the resist stripping performance of the resist stripping solution deteriorates gradually.

Accordingly, the MEA concentration of the resist stripping solution must be controlled at a specified target value, for example, 39.0 (±1.0) wt. %.

Conventionally, empirically, the degree of deterioration of the resist stripping solution was judged by the correlation with the number of boards processed or the chemical analysis or the like, but a prompt and accurate grasp of the deterioration was difficult.

According to the present invention the relation between the MEA concentration and the absorbance of the resist stripping solution was experimentally studied, and it was learned that the MEA concentration is in an advanced linear relation to the absorbance at a measuring wavelength of 1048 nm, regardless of the dissolved resist concentration, or the like, as shown in FIG. 5, and it could be measured accurately.

The absorption photometer 15 installed online in the duct 10 has compensating functions to minimize the measuring error and a absorbance controller 25.

The absorbance measurement of the sample solution led in from the duct 10 is fed into the absorbance controller 25, and at least one of the organic solvent and the MEA solution is automatically controlled by the flow rate regulating valves 21, 22 by the output signal so as to coincide with the target value, and replenished until the MEA concentration is adjusted to the target value.

Deterioration of resist stripping performance is also related with the dissolved resist concentration, aside from the MEA concentration. The resist stripping solution for board processing is taken out from the resist stripping processing tank 1 by the liquid feed pump 8, and is circulated through the resist stripping solution spray 7, and therefore the dissolved substance is gradually concentrated in the resist stripping solution.

Figure 6:
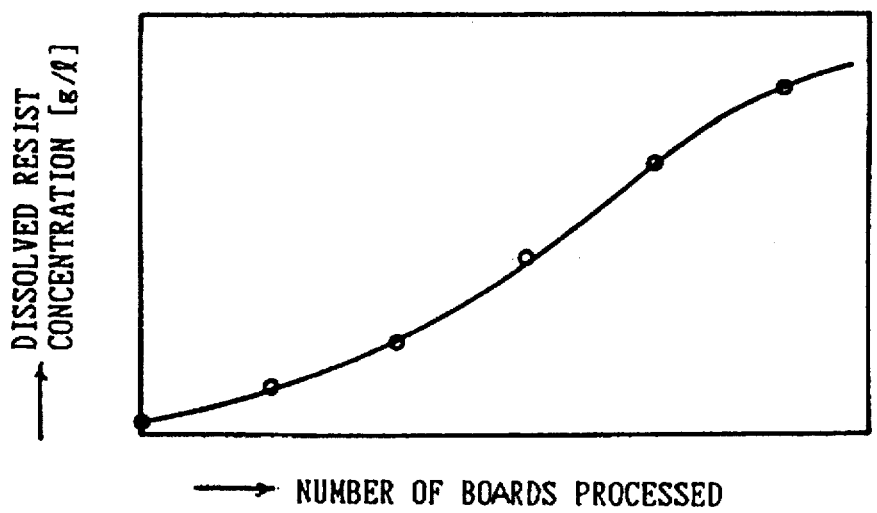
FIG. 6 is a graph of an operation example showing the relation between the number of resist stripping processing boards and the dissolved resist concentration.

As shown in operation example in FIG. 6, the main dissolved substance is resist, and is concentrated according as the number of boards processed increases, consequently, the resist stripping performance is deteriorated significantly.

Hitherto the concentration change was not measured in real time to control the resist stripping performance at a specific value. That is, the index of deterioration was the number of boards processed, but since the board shape, the resist coating thickness and the resist stripping pattern are not constant, and the dissolved resist amount varies in each type of board, and hence it is difficult to judge by the number of boards processed.

Figure 7:
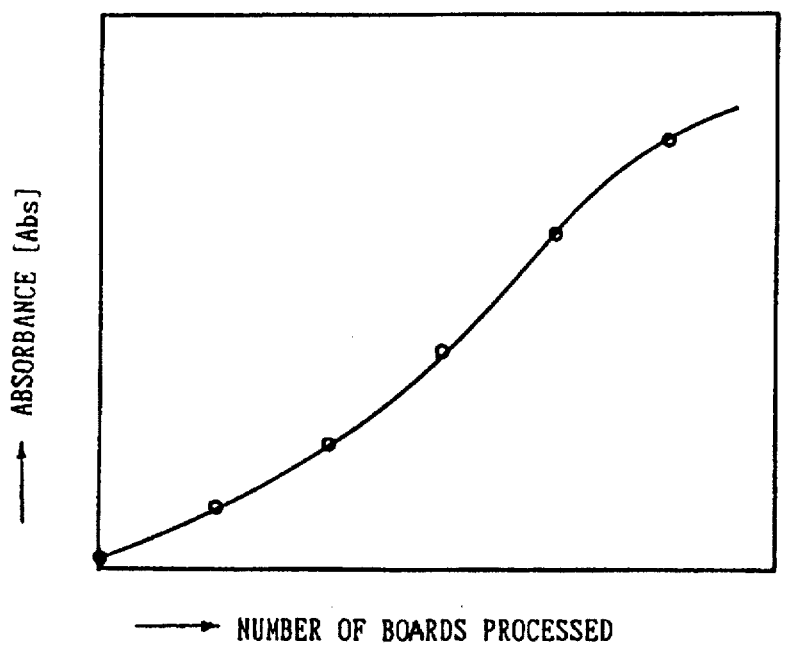
FIG. 7 is a graph of an embodiment showing the relation between the number of resist stripping processing boards and the absorbance of resist stripping solution relating to the present invention.

The present inventor attempted to measure it in relation with the absorbance from the studies on the concentrated resist contamination state of the resist stripping solution, and obtained the result as shown in FIG. 7 and 8 by experiment.

As shown in FIG. 8, the dissolved resist concentration and the absorbance are in an advanced linear relation regardless of the MEA concentration and the like, and it is possible to judge the limit of the resist stripping performance by the dissolved resist concentration itself regardless of the number of boards processed.

Meanwhile, the appropriate measuring wavelength for the dissolved resist concentration was 550 nm.

Therefore, the absorption photometer 16 installed in the duct 10 in one body with or separately from the absorption photometer 15 continuously measures the dissolved resist concentration in the resist stripping solution, and when the value exceeding the deterioration limit is detected, the discharge pump 18 is put in operation by the output signal from the absorbance controller 26, and the deteriorating resist stripping solution is drown out from the resist stripping processing tank 1, and is discharged into the drain pipe, or directly discarded out of the system.

As a result, in the resist stripping processing tank 1 lowered in level, the liquid level gauge 3 immediately detects the lowered liquid level, and a fresh resist stripping solution is replenished, and the dissolved resist concentration is diluted to the deterioration limit value, so that the resist stripping performance is recovered, and the discharge pump 18 stops.

Here is stated the functional relation of the control system intended by the apparatus in the embodiment in FIG. 1. When the resist stripping processing tank 1 is empty and building up a solution, the liquid level gauge 3 detects the empty level, and by the output signal from the liquid level controller 24, the organic solvent and the MEA solution are supplied, at a proper flow rate ratio, by regulating the valve opening degree by means of flow rate regulating valves 21, 22.

In succession, the absorption photometer 15 continuously measures the absorbance of the built-up resist stripping solution, and by the output signal from the absorbance controller 25, at least one of the organic solvent and the MEA solution is supplied, at a proper small flow rate, by regulating the valve opening degree by at least one of the flow rate regulating valve 21 and 22 so as to be controlled automatically to achieve the MEA concentration of the target value.

When the next resist stripping processing is started, lowering of the MEA concentration, drop of liquid level due to carry over by the boards, and enrichment of the dissolved resist are progressed.

When the MEA concentration is lowered, the absorbance of the resist stripping solution is continuously measured by the absorption photometer 15, and by the output signal of the absorbance controller 25, the MEA solution supplied at a proper small flow rate by regulating the valve opening degree by the flow rate regulating valve 22 so as to be controlled automatically to maintain the MEA concentration of the target value.

When the level of the solution drops as being brought out by the boards, the liquid level gauge 3 detects the lowered liquid level, and by the output signal of the liquid level controller 24, the organic solvent and the MEA solution are supplied at a proper flow rate ratio by regulating the valve opening degree by means of the flow rate regulating valves 21, 22.

When the dissolved resist is concentrated to reach the deterioration limit, the absorption photometer 16 detects the value exceeding the deterioration limit by continuously measuring the dissolved resist concentration of the resist stripping solution, and by the output signal of the absorbance controller 26, the discharge pump 18 is put in action, and the deteriorating resist stripping solution is drawn out from the resist stripping processing tank 1, and discarded into the drain pipe, or discarded directly out of the system.

As a result, the liquid level drops, and the liquid level gauge 3 detects the lowered liquid level, and by the output signal of the liquid level controller 24, the organic solvent and the MEA solution are supplied at a proper flow rate ratio by regulating the valve opening degree by the flow rate regulating valves 21, 22.

Since a fresh resist stripping solution is replenished in the resist stripping processing tank 1, the resist stripping performance is recovered as the dissolved resist concentration is diluted to the deterioration limit, and the discharge pump 18 stops.

Above the liquid level gauge 3, an overflow weir is disposed at a position not allowing to overflow usually, but a slight overflow does not matter.

Next is described the functional relation of the control system intended by the apparatus of the embodiment shown in FIG. 3. When the resist stripping processing tank 1 is empty and building up a solution, by manual operation, the organic solvent and the MEA solution are supplied at a proper flow rate ratio by regulating the valve opening degree by the flow rate regulating valves 21, 22.

Successively, the absorption photometer 15 continuously measures the absorbance of the built-up resist stripping solution, and by the output signal of the absorbance controller 25, at least one of the organic solvent and the MEA solution is supplied at a proper small flow rate by regulating the valve opening degree by at least one of the flow rate regulating valve 21 and 22 so as to be controlled automatically to reach the target value of MEA concentration.

When next resist stripping process begins, lowering of MEA concentration, drop of liquid level as brought out by boards, and enrichment of dissolved resist are advanced.

In the case of lowering of MEA concentration, the absorption photometer 15 continuously measures the absorbance of the resist stripping solution, and by the output signal of the absorbance controller 25, the MEA solution is supplied at a proper small flow rate by regulating the valve opening degree by the flow rate regulating valve 22 so as to be controlled automatically to reach the target value of MEA concentration.

When the liquid level drops as being brought out by the boards, the liquid level is slightly lover than the weir position for overflow.

When the dissolved resist is enriched to reach the deterioration limit, the absorption photometer 16 continuously measures the dissolved resist concentration in the resist stripping solution, and when any value exceeding the deterioration limit is detected, by the output signal of the absorbance controller 26, the organic solvent and the MEA solution are supplied at a proper flow rate ratio by regulating the valve opening degree by the flow rate regulating valves 21, 22.

Since a fresh resist stripping solution is replenished, the dissolved resist concentration is diluted to the deterioration limit value, so that the resist stripping performance is recovered.

The liquid level is near the weir position for overflow, and when the organic solvent or the MEA solution is replenished, the deteriorating resist stripping solution overflows from the overflow weir.

The present inventor, by applying the results on the basis of the control functions in mutually complementary relations as described above, found by experiment that the recovery of resist stripping performance, continuous operation, and saving of consumption of resist stripping solution can be realized easily and comprehensively.

Figure 9:
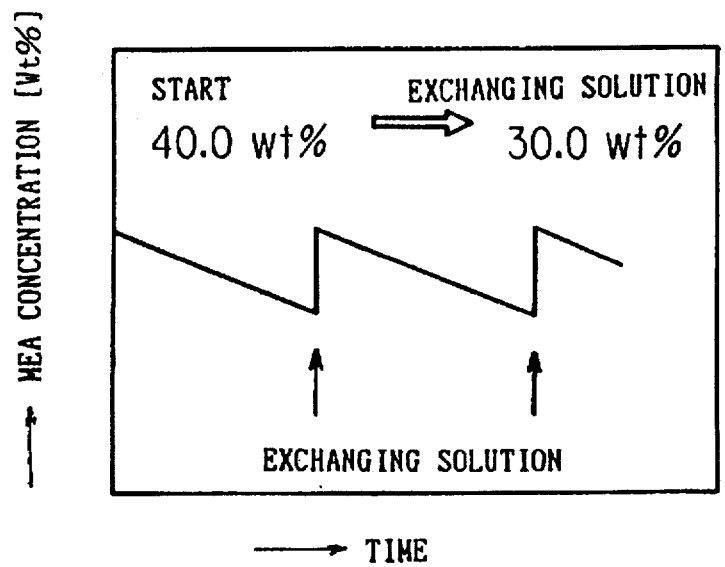
FIG. 9 is a graph showing the relation between the MEA concentration and the operation time in the conventional method.

Moreover, for conceptual understanding, the operation pattern effects are compared between the invention and the prior art in FIGS. 9 to 12. In the prior art, as shown in FIG. 9, the starting MEA concentration was, for example, 40.0 wt. %, and the solution was exchanged when the concentration was lowered to, for example, 30.0 wt. % (chemical analysis value) in the course of time.

In this case, the MEA concentration transition is in a sawtooth profile, and due to variation width of the MEA concentration, the resist stripping performance was not constant.

Figure 10:
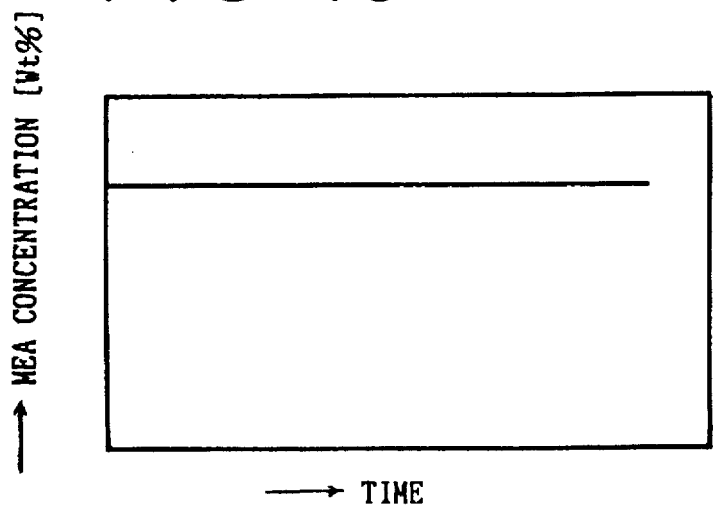
FIG. 10 is a graph showing the relation between the MEA concentration and the operation time when the apparatus of the present invention is used.

By the apparatus of the invention, on the other hand, as shown in FIG. 10, the MEA concentration remains constant at, for example, 39.0±1.0 wt. % in the course of time, and the resist stripping performance is constant, and it is not necessary to exchange the solution.

Figure 11:
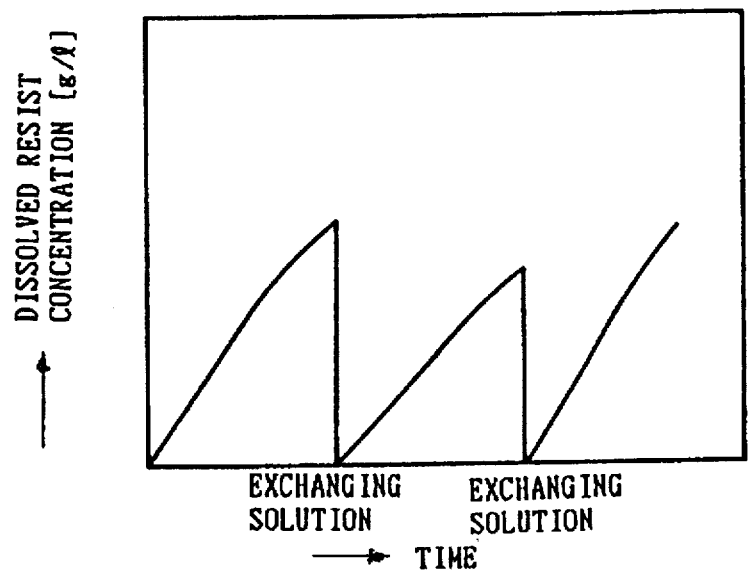
FIG. 11 is a graph showing the relation between the dissolved resist concentration and the operation time in the conventional method.

In the prior art, moreover, as shown in FIG. 11, the starting dissolved resist concentration increased as the time passed, and the solution was exchanged when the concentration reached a rigion of the resist stripping performance deteriorations.

In this case, as shown in FIG. 11, the time course change of the dissolved resist concentration is in a sawtooth profile, and variation width occurred in the dissolved resist concentration, and hence the resist stripping performance was not stable.

Figure 12:
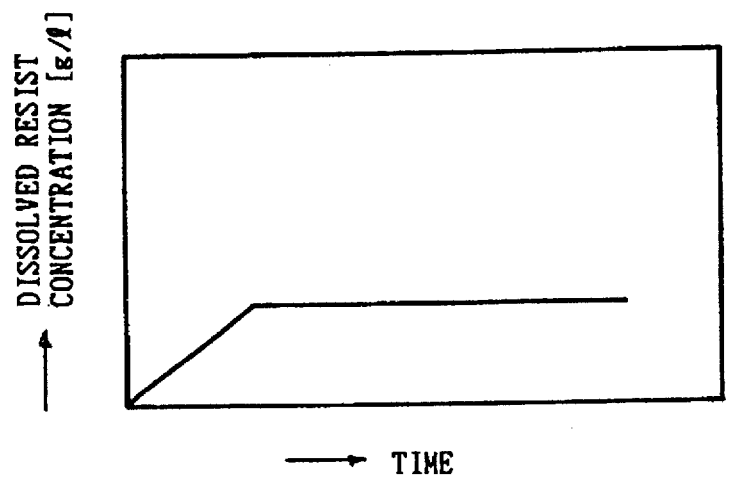
FIG. 12 is a graph showing the relation between the dissolved resist concentration and the operation time when the apparatus of the present invention is used.

According to the apparatus of the invention, by contrast, the dissolved resist concentration remains constant after a certain time lapse as shown in FIG. 12, and the resist stripping performance is stable, and it is not necessary to exchange the solution.

As mentioned above, the invention can be applied not only in case that the blending solution of BDG and MEA is used as the resist stripping solution, but also in case that the blending solution of organic solvent solution other than BDG and alkanolamine solution other than MEA is used.

Thus, having such construction, the invention brings about the following effects.

(1) By applying the invention in the liquid crystal board manufacturing process, the semiconductor manufacturing process or the like, the alkanolamine concentration and the dissolved resist concentration in the resist stripping solution are always monitored and controlled with the desired target range, and continuous operation is possible for a long period at a stable liquid level.

(2) Since the quality of the resist stripping solution can be controlled constant, the resist stripping performance of board is stable, and when applied in the liquid crystal board manufacturing process, semiconductor manufacturing process or the like, comprehensive effects are achieved, including a significant saving of consumption of solution, rise of yield, decrease of down time, and reduction of labor cost.

Having described preferred embodiments of the invention with reference to the accompanying drawings, it is to be understood that the invention is not limited to those precise embodiments, and that various change and modifications may be effected therein by one skilled in the art without departing from the scope or spirit of the invention as defined in the appended claims.

What is claimed is:

1. An apparatus for controlling a resist stripping solution, comprising: a liquid level gauge; two absorption photometers; first replenishing means; second replenishing means; and resist stripping solution discharge means for discharging resist stripping solution by detecting the dissolved resist concentration in the resist stripping solution employing one of said two absorption photometers, wherein said first replenishing means replenishes organic solvent and alkanolamine by detecting the liquid level of the resist stripping solution employing said liquid level gauge, and wherein said second replenishing means replenishes at least one of organic solvent and alkanolamine by detecting the alkanolamine concentration of the resist stripping solution employing the other of said two absorption photometers.

2. An apparatus for controlling a resist stripping solution, comprising: a liquid level gauge; two absorption photometers, first replenishing means; second replenishing means; and resist stripping solution discharge means for discharging resist stripping solution by detecting the dissolved resist concentration in the resist stripping solution employing one of said two absorption photometers, wherein said first replenishing means replenishes a fresh resist stripping solution which is a blend of an organic solvent and alkanolamine by detecting the liquid level of the resist stripping solution employing said liquid level gauge, and wherein said second replenishing means replenishes at least one of organic solvent and alkanolamine by detecting the alkanolamine concentration of the resist stripping solution employing the other of said two absorption photometers.

3. An apparatus for controlling a resist stripping solution, comprising: two absorption photometers; organic solvent or/and alkanolamine replenishing means; and organic solvent and alkanolamine replenishing means for replenishing organic solvent and alkanolamine by detecting the dissolved resist concentration in the resist stripping solution employing one of said two absorption photometers, and wherein said organic solvent or/and alkanolamine replenishing means replenishes at least one of organic solvent and alkanolamine by detecting the alkanolamine concentration of the resist stripping solution employing the other of said two absorption photometers.

4. An apparatus for controlling a resist stripping solution, comprising: two absorption photometers; organic solvent or/and alkanolamine replenishing means; and fresh solution replenishing means for replenishing a fresh resist stripping solution which is a blend of an organic solvent and alkanolamine by detecting the dissolved resist concentration in the resist stripping solution employing one of said two absorption photometers, and wherein said organic solvent or/and alkanolamine replenishing means replenishes at least one of organic solvent and alkanolamine by detecting the alkanolamine concentration of the resist stripping solution employing the other of said two absorption photometers.

* * * * *